US011863187B2

(12) United States Patent
Jadhav et al.

(10) Patent No.: US 11,863,187 B2
(45) Date of Patent: Jan. 2, 2024

(54) D-TYPE WHOLLY DISSIMILAR HIGH-SPEED STATIC SET-RESET FLIP FLOP

(71) Applicant: Synopsys, Inc., Mountain View, CA (US)

(72) Inventors: Pradip Jadhav, Karnataka (IN); Michael McManus, Hamilton, OH (US)

(73) Assignee: Synopsys, Inc., Sunnyvale, CA (US)

( * ) Notice: Subject to any disclaimer, the term of this patent is extended or adjusted under 35 U.S.C. 154(b) by 0 days.

(21) Appl. No.: 17/832,090

(22) Filed: Jun. 3, 2022

(65) Prior Publication Data
US 2022/0399881 A1 Dec. 15, 2022

Related U.S. Application Data

(60) Provisional application No. 63/196,522, filed on Jun. 3, 2021.

(51) Int. Cl.
*H03K 3/037* (2006.01)
(52) U.S. Cl.
CPC ................. *H03K 3/0372* (2013.01)
(58) Field of Classification Search
CPC .......... H03K 3/0372; H03K 3/356139; H03K 3/356156; H03K 3/35625; H03K 3/012; H03K 3/356121; H03K 3/0375; H03K 3/356104; H03K 19/003; H03K 3/013; H03K 3/356173; H03K 5/133; G11C 13/0011; G11C 13/0007; G11C 11/4078; G11C 11/4125; G11C 17/18; G11C 17/16; G11C 14/009

See application file for complete search history.

(56) References Cited

U.S. PATENT DOCUMENTS

| 5,140,179 | A | * | 8/1992 | Takano | ................ | H03K 3/3562 |
| | | | | | | 327/203 |
| 2002/0093368 | A1 | * | 7/2002 | Fulkerson | .............. | H03K 3/012 |
| | | | | | | 327/203 |

(Continued)

FOREIGN PATENT DOCUMENTS

| EP | 0472426 A2 | 2/1992 |
| WO | 2015/005992 A1 | 1/2015 |

OTHER PUBLICATIONS

PCT International Search Report and Written Opinion for International Application No. PCT/US22/32132, dated Sep. 26, 2022, 11 pages.

*Primary Examiner* — John W Poos
*Assistant Examiner* — Tyler J Pereny
(74) *Attorney, Agent, or Firm* — Lowenstein Sandler LLP

(57) ABSTRACT

A circuit is provided. The circuit includes a first master stage, a second master stage, a first slave stage, a first slave stage, and a second slave stage. The first master stage includes a data input line. The second master stage includes an inverse data input line. The first slave stage is coupled to an output of the first master stage. The second slave stage is coupled to an output of the second master stage. The first slave stage generates an output signal during a rising edge of a clock cycle. The second slave stage generates an inverted output signal during the rising edge of the clock cycle. The output signal and the inverted output signal are available concurrently.

20 Claims, 8 Drawing Sheets

(56) References Cited

U.S. PATENT DOCUMENTS

| | | | |
|---|---|---|---|
| 2008/0180139 A1* | 7/2008 | Natonio | H03K 3/35625 |
| | | | 327/218 |
| 2009/0108885 A1 | 4/2009 | Natonio et al. | |
| 2016/0097811 A1* | 4/2016 | Kim | G01R 31/318541 |
| | | | 714/726 |

* cited by examiner

D-TYPE WHOLLY DISSIMILAR HIGH-SPEED STATIC SET-RESET FLIP FLOP

RELATED APPLICATION

The present application claims the benefit under 35 U.S.C. § 119(e) of U.S. Provisional Patent Application No. 63/196,522 filed on Jun. 3, 2021, which is incorporated herein by reference in its entirety for all purposes.

TECHNICAL FIELD

The present disclosure relates to an integrated circuit design. In particular, the present disclosure is related to a D-type wholly dissimilar high-speed static set-reset flip-flop.

BACKGROUND

Advances in technology have resulted in smaller and more powerful computing devices. For example, various portable personal computing devices currently exist, including wireless computing devices, such as mobile wireless telephones, personal digital assistants (PDAs), and paging devices that are small, lightweight, and easily carried by users.

Ubiquitous among these computing devices are flip-flops, which are typically designed with low latency and power consumption applications in mind. Therefore, the design of these flip-flops has far-reaching implications for overall designs of computing devices.

SUMMARY

In some aspects, a circuit includes a first master stage, a second master stage, a first slave stage, a first slave stage, and a second slave stage. The first master stage includes a data input line. The second master stage includes an inverse data input line. The first slave stage is coupled to an output of the first master stage. The second slave stage is coupled to an output of the second master stage. The first slave stage generates an output signal during a rising edge of a clock cycle. The second slave stage generates an inverted output signal during the rising edge of the clock cycle. The output signal and the inverted output signal are available concurrently.

In some aspects, a method includes generating an inverted signal of a data input signal using an inverter, applying the data input signal as an input to a first circuit path during the rising edge of the clock cycle to generate an output signal, and applying the inverted signal as an input to a second circuit path during the rising edge of the clock cycle to generate an inverted output signal during the rising edge of the clock cycle. The inverted signal of the data input signal and the data input signal are available for input during a rising edge of a clock cycle. The output signal and the inverted output signal are available concurrently.

BRIEF DESCRIPTION OF THE DRAWINGS

The disclosure will be understood more fully from the detailed description given below and from the accompanying figures of embodiments of the disclosure. The figures are used to provide knowledge and understanding of embodiments of the disclosure and do not limit the scope of the disclosure to these specific embodiments. Furthermore, the figures are not necessarily drawn to scale.

DETAILED DESCRIPTION

Figure 1:
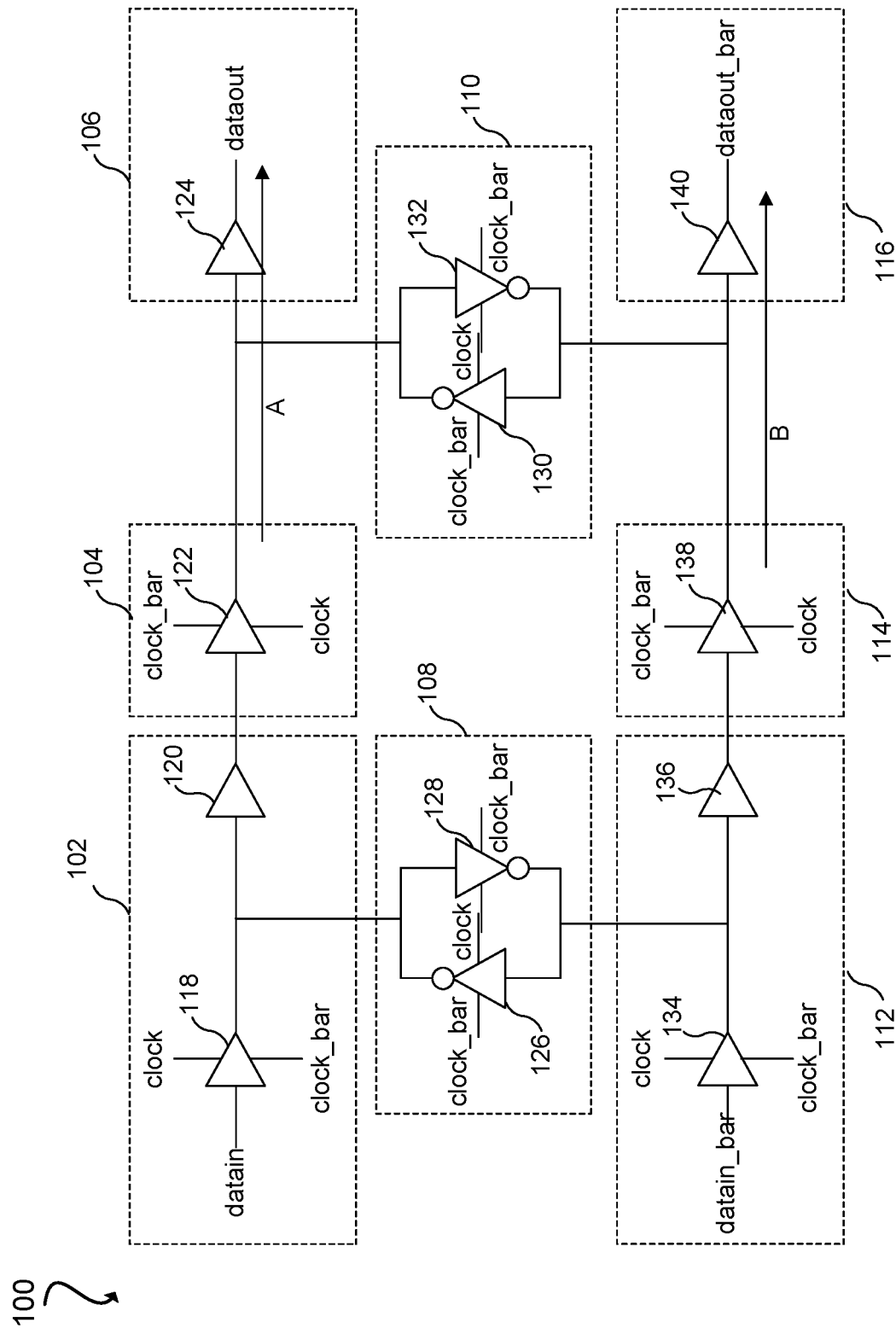
FIG. 1 is a schematic of a circuit for generating inverted and non-inverted output signals using differential flip-flops without a set and reset functionality, in accordance with an embodiment of the present disclosure.

Aspects of the present disclosure relate to a D-type wholly dissimilar high-speed static set-reset flip-flop.

A typical differential circuit supplies both inverted and non-inverted signals to subsequent logic. However, most flip-flops generate a single-ended output and an inverted signal for the generated single-ended output may be generated using an additional inverter. For example, the typical differential circuit may include two separate paths: one path is to generate a non-inverted signal, and the other path is to generate an inverted signal. The output path for the inverted and the non-inverted signal each may follow a different path. The other path may include the additional inverter. The additional inverter used for generating the inverted signal carries a speed penalty and places the two signals out of alignment. There may be a delay (one inverter) between the generated inverted and non-inverted signals. This delay may result in a phase difference between the inverted and non-inverted signal.

Embodiments described herein generate an inverted signal and a non-inverted signal at the same time such that there is no phase difference between the inverted and the non-inverted signal. In some aspects, a data path is substantially similar between the inverted signal and the non-inverted signal. That is, the number of devices in the data path of the inverted signal and the number of devices in the data path of the non-inverted signal are close to each other. In some aspects, the data path may be from a clock input to an output (i.e., to the inverted signal and to the non-inverted signal).

Technical advantages of the present disclosure include, but are not limited to, improvement in the performance of an integrated circuit by equalizing worst-case delays. The simultaneous (or without phase difference) generation of inverted and non-inverted signals is beneficial to combinational elements, such as decoders and multiplexers, where a phase difference between the inverted and non-inverted signals may cause glitches. By way of a non-limiting example, differential flip-flops are a reasonable choice for such decoders and multiplexers.

In some embodiments, in the integrated circuit, two different but substantially similar circuit paths may be used to generate both the inverted signal and the non-inverted signal. In the circuit path, cross-coupled circuit (e.g., p-transistors as pull-up devices) may be used to achieve high energy efficiency. By way of a non-limited example, the integrated circuit may be related to 5 nm and/or 7 nm FINFET technology. Though various embodiments in the present disclosure are described using D-type flip-flop, the embodiments may be practiced using other types of flip-flops as well.

In some embodiments, a data signal may be provided to a first path of the integrated circuit to generate the non-inverted signal and an inverse data signal may be provided to a second path of the integrated circuit to generate the inverted signal. In some aspects, the data signal and the inverse data signal may be provided simultaneously to the first path and to the second path, respectively. For example, the data signal and the inverse data signal may be provided at a rising edge of a clock cycle to the first path and the second path, respectively.

In some aspects, the differential circuit may provide set/reset capability while maintaining a no-phase difference between the inverted signal and the non-inverted signal. The differential circuit may include a feedback circuit to pass a set/reset signal from the first path to the second path of the integrated circuit.

FIG. 1 is a schematic of a circuit diagram 100 for differential flip-flops according to aspects of the disclosure. As shown in FIG. 1, the path from data input to output for both the inverted and the non-inverted signal is identical (labelled path A and path B in FIG. 1). An inverted data input is used to generate the inverted output signal. As a result, when the data and its inverted data signals are gated through the flip-flops, the generated non-inverted and inverted signals may not have a phase difference. The inverted and the non-inverted signals are generated simultaneously. That is, the inverted and the non-inverted signals are available concurrently (at the same time).

Circuit 100 includes a data master block 102, a data master-slave switch 104, a data slave block 106, a master cross-coupled feedback 108, a slave cross-coupled feedback 110, an inverse data master block 112, an inverse master slave switch 114, and an inverse slave block 116. Data master block 102 may comprise a data input line that is configured to receive a data signal. Inverse data master block 112 may comprise an inverse data input line that is configured to receive an inverse of the data signal. Data slave block 106 is configured to generate an output data signal during a rising edge of a clock cycle. Inverse slave block 116 is configured to generate the inverse of the output data signal at the rising edge of the clock cycle.

Data master block 102 may include a tri-state buffer 118 and a buffer 120. In some aspects, tri-state buffer 118 may be a tri-state inverter. Switch 104 includes a buffer 122. Buffer 122 may be controlled by a clock signal and the inverse of the clock signal. The inverse signal may be generated using a single stage inverter, a two-stage inverter, and the like or using an external circuit (e.g., a two-phase clock signal from the external circuit). Data slave block 106 includes a buffer 124.

Master cross-coupled feedback 108 is coupled between an output of buffer 118 and the output of buffer 134. Master cross-coupled feedback 108 includes an inverter 126 and an inverter 128.

Slave cross-coupled feedback 110 is coupled between the output of data master slave switch 104 and the output of inverse data master slave switch 114. Slave cross-coupled feedback 110 includes an inverter 130 and an inverter 132.

Inverse data master block 112 includes a buffer 134 and a buffer 136. Inverse master slave switch 114 includes a buffer 138. Inverse slave block 116 includes a buffer 140. An output of inverse data master block 112 is coupled to the input of inverse master slave switch 114. The output of the inverse master slave switch 114 is coupled to inverse slave block 116.

Figure 2:
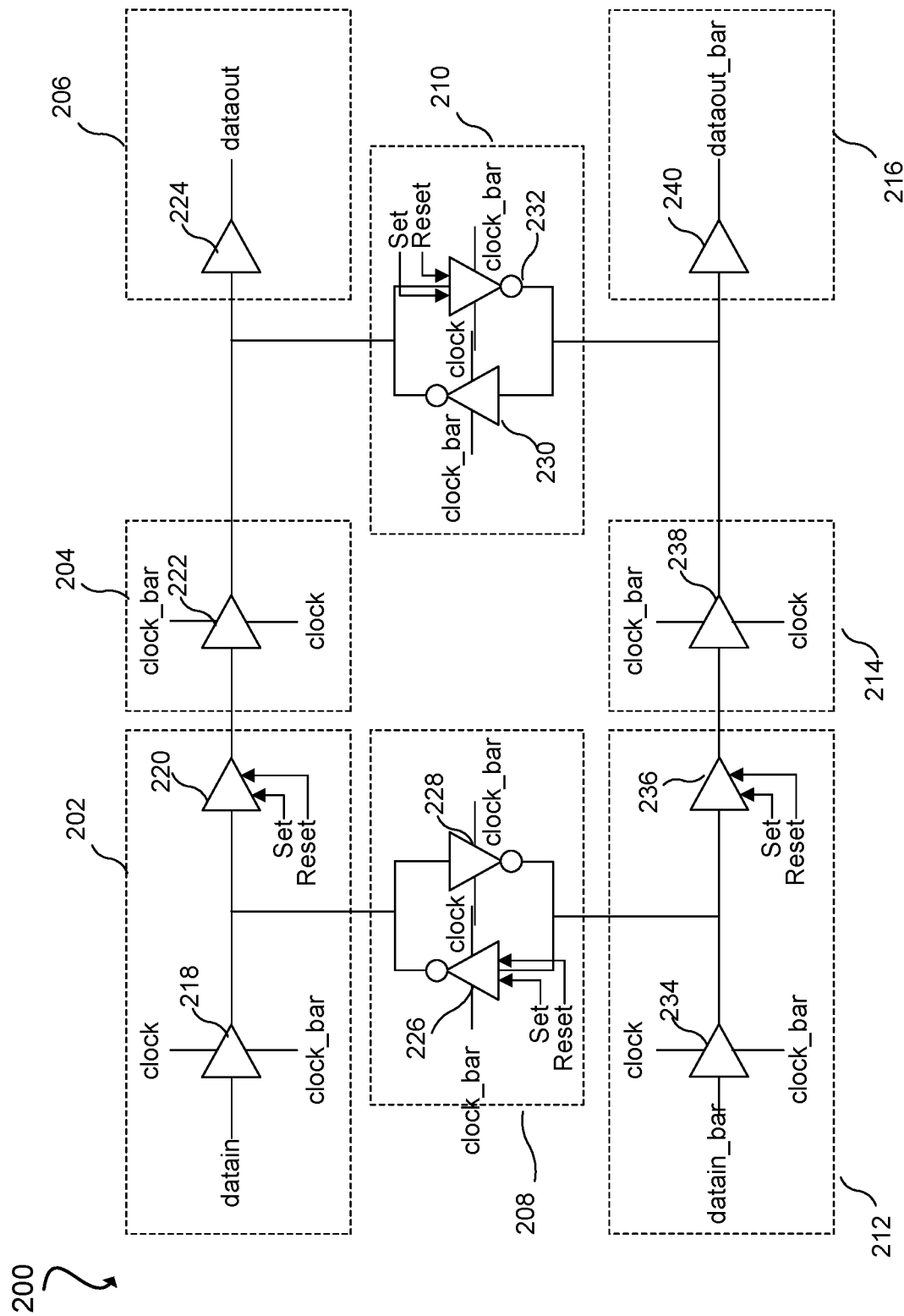
FIG. 2 is a schematic of a circuit for generating inverted and non-inverted output signals using differential flip-flops with a set and reset functionality, in accordance with an embodiment of the present disclosure.

FIG. 2 is a schematic that shows a circuit 200 for generating inverted and non-inverted output signals using differential flip-flops with a set and reset functionality, according to aspects of the disclosure.

Circuit 200 includes a data master block 202, a data master-slave switch 204, a data slave block 206, a master cross-coupled feedback 208, a slave cross-coupled feedback 210, an inverse data master block 212, an inverse master slave switch 214, and an inverse slave block 216. Data master block 202 may comprise a data input line that is configured to receive a data signal. Inverse data master block 212 is configured to receive an inverse of the data signal. Data slave block 206 is configured to generate an output data signal during a rising edge of a clock cycle. Inverse slave block 216 is configured to generate the inverse of the output data signal at the rising edge of the clock cycle. Master cross-coupled feedback 208 and slave cross-coupled feedback 210 pass a set/reset signal from the first path to the second path or from the second path to the first path. In some aspects, master cross-coupled feedback 208 and slave cross-coupled feedback 210 are not in the data path.

Data master block 202 may include a buffer 218 and a buffer 220. In some aspects, buffer 220 may have a set and reset functionality. Buffer 220 may be coupled to a set signal and to a reset signal. Switch 204 includes a buffer 222. Buffer 222 may be controlled by a clock signal and the inverse of the clock signal. The inverse signal may be generated using a single stage inverter, a two-stage inverter, or the like or using an external circuit (e.g., a two-phase clock signal from the external circuit).

Master cross-coupled feedback 208 is coupled between an output of buffer 218 and the output of buffer 234. Master cross-coupled feedback 208 includes an inverter 226 and an inverter 228. In some aspects, inverter 226 may be coupled to the set signal and to the reset signal.

Slave cross-coupled feedback 210 is coupled between the output of data master slave switch 204 and the output of inverse data master slave switch 214. Slave cross-coupled feedback 210 includes an inverter 230 and an inverter 232. Inverter 232 may be coupled to the set signal and to the reset signal. The master cross-coupled feedback 208 and the slave-cross-coupled feedback 210 are configured to pass a set/reset to the other path.

Inverse data master block 212 includes a buffer 234 and a buffer 236. Buffer 236 may have a set/reset functionality. Buffer 236 may be coupled to the set and to the reset signal. Inverse master slave switch 214 includes a buffer 238. Inverse slave block 216 includes buffer 240. An output of inverse data master block 212 is coupled to the input of inverse master slave switch 214. The output of the inverse master slave switch is coupled to inverse slave block 216.

Figure 3:
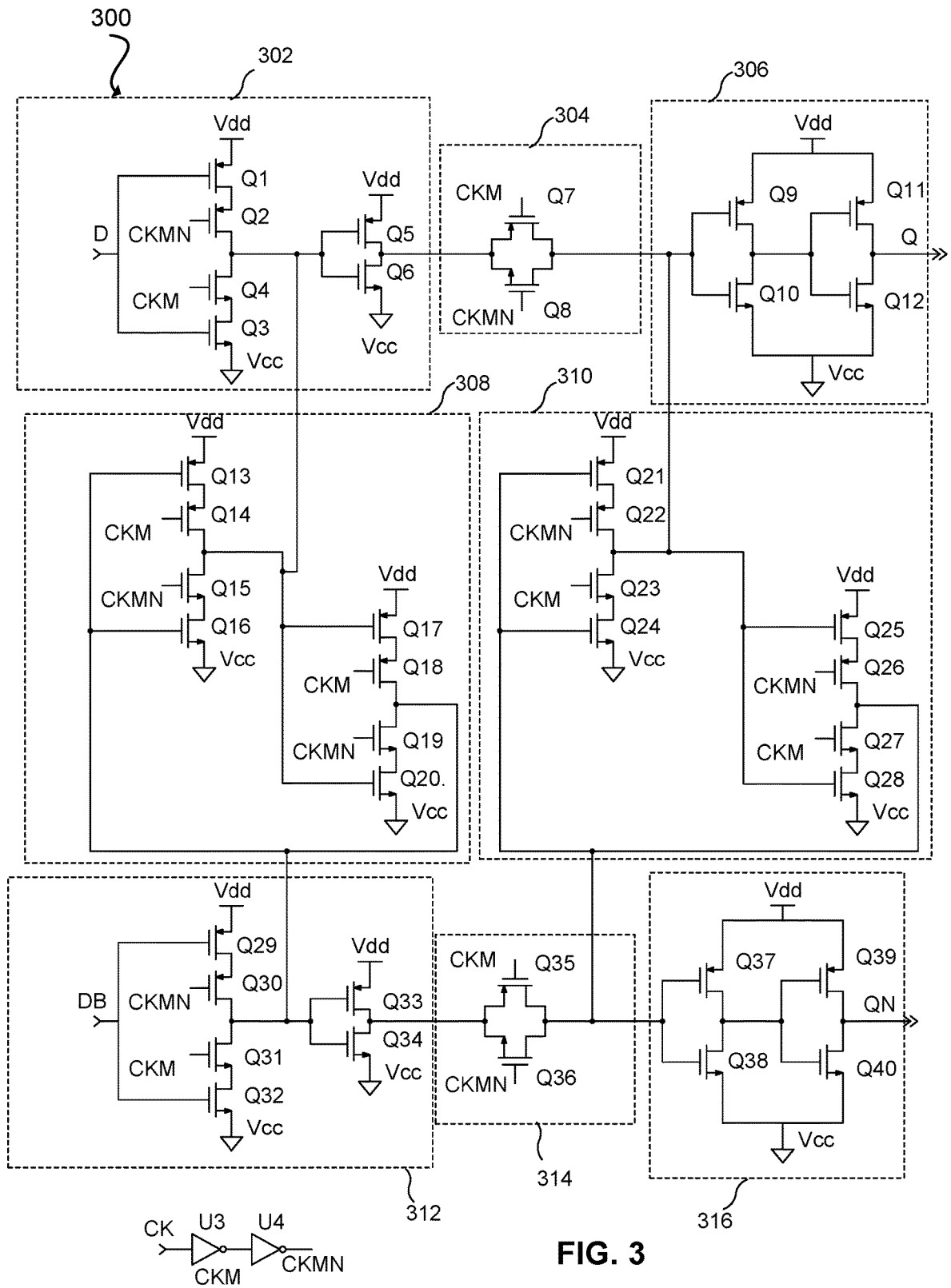
FIG. 3 is a schematic of a circuit for generating inverted and non-inverted output signals using differential flip-flops without a set and reset functionality, in accordance with an embodiment of the present disclosure.

FIG. 3 is a schematic that shows a circuit 300 for generating inverted and non-inverted output signals using differential flip-flops without a set and reset functionality in accordance with some embodiments. The path from data input to output for both the inverted and the non-inverted signal is identical.

Circuit 300 includes a data master block 302, a data master-slave switch 304, a data slave block 306, a master cross-coupled feedback 308, a slave cross-coupled feedback 310, an inverse data master block 312, an inverse master slave switch 314, and an inverse slave block 316.

As shown in FIG. 3, the path from data input to output for both the inverted and the non-inverted signal are identical. That is the number of devices in both paths are substantially the same.

Data master block 302 may include a transistor Q1, a transistor Q2, a transistor Q3, a transistor Q4, a transistor Q5, and a transistor Q6. In some aspects, the transistors of circuit 300 may be metal oxide semiconductor field effect transistors (MOSFETs). In some aspects, transistor Q1, transistor Q2, transistor Q5 may be p-type transistors. Transistor Q4, transistor Q3, and transistor Q6 may be n-type transistors.

A data signal D is coupled to a gate of transistor Q1 and to a gate of transistor Q3. The drain of transistor Q1 is coupled to the source of transistor Q2. The drain of transistor Q2 is coupled to the drain of transistor Q4. The source of transistor Q4 is coupled to the drain of transistor Q3. Transistor Q1 and transistor Q5 are coupled to a power supply (labelled Vdd in FIG. 3).

In some aspects, the respective gate of transistor Q5 and transistor Q6 are coupled to the drain of transistor Q2 and transistor Q4.

Data master-slave switch 304 includes a transistor Q7 and a transistor Q8. The respective source of transistor Q7 and transistor Q8 are coupled to the drain of transistor Q5 and transistor Q6. Transistor Q7 and transistor Q8 are gated by a clock signal and the inverse clock signal respectively (labelled CKM and CKMN in FIG. 3). The source of transistor Q7 is coupled to the source of transistor Q8. In some aspects, transistor Q7 is a p-type transistor and Q8 is a n-type transistor.

Data slave block 306 includes a transistor Q9, a transistor Q10, a transistor Q11, and a transistor Q12. The drain of transistor Q9 is coupled to the drain of transistor Q10. The drain of transistor Q11 is coupled to the drain of transistor Q12. The gate of transistor Q11 and the gate of transistor Q12 are coupled to the drain of transistor Q9. The drain of transistor Q7 and the drain of transistor Q8 are coupled to the gate of transistor Q9 and the gate of transistor Q10. The output signal may be taken from the drain of transistor Q12. In some aspects, transistor Q9 and transistor Q11 are p-type transistors. Transistor Q10 and transistor Q12 are n-type transistors.

Master cross-coupled feedback 308 includes a transistor Q13, a transistor Q14, a transistor Q15, a transistor Q16, a transistor Q17, a transistor Q18, and a transistor Q19, a transistor Q20. In some aspects, transistor Q13, transistor Q14, transistor Q17, and transistor Q18 are p-type transistors. Transistor Q15, transistor Q16, transistor Q19, and transistor Q20 are n-type transistors. Transistor Q14 and transistor Q15 are gated by the clock signal and the inverse clock signal respectively. Transistor Q18 and transistor Q19 are gated by the clock signal and the inverse clock signal, respectively. The drain of transistor Q14 is coupled to the gate of transistor Q17 and to the gate of transistor Q20. The drain of transistor Q18 is coupled to the gate of transistor Q13 and to the gate of transistor Q16.

Slave cross-coupled feedback 310 includes a transistor Q21, a transistor Q22, a transistor Q23, a transistor Q24, a transistor Q25, a transistor Q26, a transistor Q27, and a transistor Q28. In some aspects, transistor Q21, transistor Q22, transistor Q25, and transistor Q26 are p-type transistors. Transistor Q23, transistor Q24, transistor Q27, and transistor Q28 are n-type transistors. Transistor Q22 and transistor Q27 are gated by the clock signal. Transistor Q22 and transistor Q26 are gated by the inverse of the clock signal. The drain of transistor Q22 is coupled to the gate of transistor Q25 and transistor Q28. The drain of transistor Q26 is coupled to the gate of transistor Q21 and transistor Q24.

Inverse data master block 312 includes a transistor Q29, a transistor Q30, a transistor Q31, a transistor Q32, a transistor Q33, and a transistor Q34. In some aspects, transistor Q29, transistor Q30, transistor Q33, are p-type transistors. Transistor Q31, transistor Q32, and transistor Q34 are n-type transistors.

The inverse of the data signal (labelled DB in FIG. 3) is coupled to a gate of transistor Q29 and to a gate of transistor Q32. The drain of transistor Q29 is coupled to the source of transistor Q30. The drain of transistor Q30 is coupled to the drain of transistor Q31. The source of transistor Q31 is coupled to the drain of transistor Q32.

In some aspects, the respective gate of transistor Q33 and transistor Q34 are coupled to the drain of transistor Q31 and to the drain of transistor Q32.

Inverse master slave switch 314 includes a transistor Q35 and a transistor Q36. Transistor Q35 may be a p-type transistor. Transistor Q36 may be a n-type transistor. The source of transistor Q35 is coupled to the source of transistor Q36 and to the drain of transistor Q33.

Inverse slave block 316 includes a transistor Q37, a transistor Q38, a transistor Q39, and a transistor Q40. Transistor Q37 and transistor Q39 may be p-type transistors. The drain of transistor Q37 and the drain of transistor Q38 are coupled to the gate of transistor Q39 and the gate of transistor Q40 and to the drain of transistor Q26. The output signal (i.e., the inverted signal, labelled QN in FIG. 3) is from the drain of transistor Q40.

In some aspects, the clock signal and the inverse clock signal may be generated using a single inverter, two inverters (e.g., U3 and U4 in FIG. 3), or any other number of inverters. In some aspects, the clock signal and the inverse clock signal may be provided from a two-phase clock from an external circuit.

As shown in FIG. 3, each path from the input to the output signal for the inverted and the non-inverted signals includes identical master and slave latches. When the clock signal is low, the input data overwrites the contents of the master latch, and when the clock signal is high, the master latch overwrites the contents of the slave latch. Because the differential flip-flop design described herein is static, the clock can run at any frequency up to its maximum value.

Figure 4:
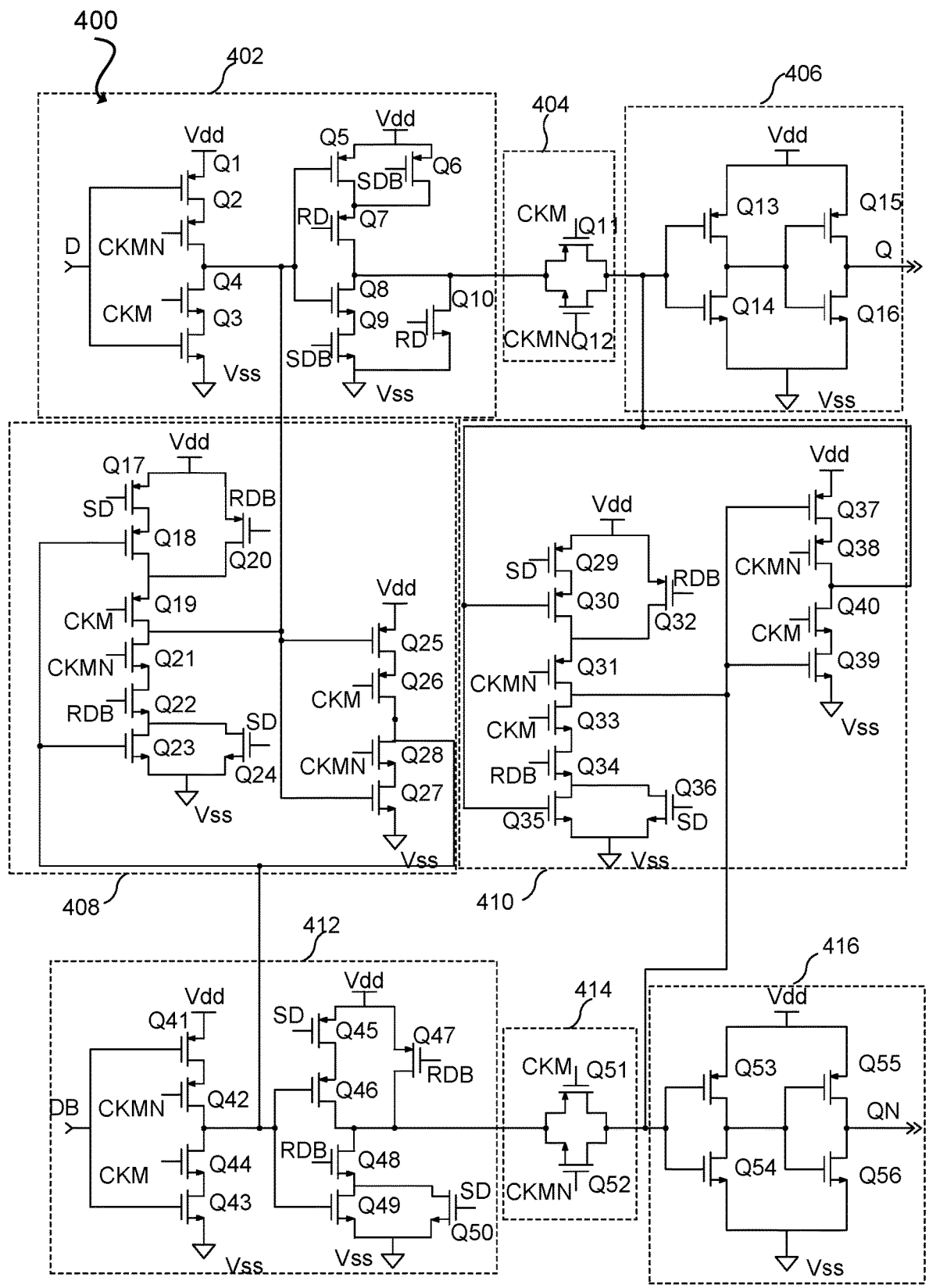
FIG. 4 is a schematic of a circuit for generating inverted and non-inverted output signals using differential flip-flops with a set and reset functionality, in accordance with an embodiment of the present disclosure.

FIG. 4 is a schematic of a circuit 400 for generating inverted and non-inverted output signals using differential flip-flops with a set and reset functionality, in accordance with an embodiment of the present disclosure. The path from data input to output for both the inverted and the non-inverted signal is substantially identical. That is the number of devices in both paths are substantially the same.

Circuit 400 includes a data master block 402, a data master-slave switch 404, a data slave block 406, a master cross-coupled feedback 408, a slave cross-coupled feedback 410, an inverse data master block 412, an inverse master slave switch 414, and an inverse slave block 416.

Data master block 402 may include a transistor Q1, a transistor Q2, a transistor Q3, a transistor Q4, a transistor Q5, a transistor Q6, a transistor Q7, a transistor Q8, a transistor Q9, and a transistor Q10. Transistor Q1, transistor Q2, transistor Q5, transistor Q6, and transistor Q7 may be p-type transistors. Transistor Q3, transistor Q4, transistor Q8, transistor Q9, and transistor Q10 may be n-type transistors. A data signal (labelled D in FIG. 4) is coupled to a gate of transistor Q1 and to a gate of transistor Q3. The drain of transistor Q1 is coupled to the source of transistor Q2. The drain of transistor Q2 is coupled to the drain of transistor Q4. The source of transistor Q4 is coupled to the drain of transistor Q3.

In some aspects, transistor Q5 and transistor Q6 are coupled in parallel. Transistor Q10 is coupled between the drain of transistor Q8 and the source of transistor Q9. Transistor Q6 and transistor Q9 are gated by a set signal (labelled SDB in FIG. 4). Transistor Q7 and transistor Q10 are gated by a reset signal (labelled RD in FIG. 4). The gate of transistor Q5 and the gate of transistor Q8 are coupled to the drain of transistor Q2.

Data master-slave switch 404 includes a transistor Q11 and a transistor Q12. Transistor Q11 may be a p-type transistor. Transistor Q12 may be a n-type transistor. The respective source of transistor Q11 and transistor Q12 are coupled to the drain of transistor Q10. Transistor Q11 and transistor Q12 are gated by a clock signal and the inverse clock signal respectively. The source of transistor Q11 is coupled to the source of transistor Q12.

Data slave block 406 includes a transistor Q13, a transistor Q14, a transistor Q15, and a transistor Q16. In some aspects, transistor Q13 and transistor Q15 are p-type transistors. Transistor Q14 and transistor Q16 are n-type transistors. The drain of transistor Q13 and the drain of transistor Q14 are coupled to the gate of transistor Q15 and to the gate of transistor Q16. The drain of transistor Q15 is coupled to the drain of transistor Q16.

Master cross-coupled feedback 408 includes a transistor Q17, a transistor Q18, a transistor Q19, a transistor Q20, a transistor Q21, a transistor Q22, a transistor Q23, a transistor Q24, a transistor Q25, a transistor Q26, a transistor Q27, and a transistor Q28. In some aspects, transistor Q17, transistor Q18, transistor Q20, transistor Q19, transistor Q25, and transistor Q26 may be p-type transistors. Transistor Q21, transistor Q22, transistor Q23, transistor Q24, transistor Q28, and transistor Q27 may be n-type transistors.

Transistor Q19 and transistor Q26 are gated by the clock signal. Transistor Q21 and transistor Q28 are gated by the inverse clock signal. Transistor Q17, transistor Q24 are gated by the set signal. Transistor Q20 and transistor Q22 are gated by the reset signal.

The drain of transistor Q17 is coupled to the source of transistor Q18. Transistor Q20 is coupled between transistor Q17 and transistor Q18. The source of transistor Q19 is coupled to the drain of transistor Q18. The drain of transistor Q21 is coupled to the transistor Q19. The drain of transistor Q22 is coupled to the source of transistor Q21. The source of transistor Q21 is coupled to the gate of transistor Q27. The drain of transistor Q23 and the drain of transistor Q24 are coupled to the source of transistor Q22.

The gate of transistor Q25 and the gate of transistor Q27 are coupled to the drain of transistor Q2. The source of transistor Q26 is coupled to the drain of transistor Q25. The drain of transistor Q28 is coupled to the drain of transistor Q26. The drain of transistor Q27 is coupled to the source of transistor Q28.

Slave cross-coupled feedback 410 includes a transistor Q29, a transistor Q30, a transistor Q31, a transistor Q32, a transistor Q33, a transistor Q34, a transistor Q35, a transistor Q36, a transistor Q37, a transistor Q38, a transistor Q39, and a transistor Q40. In some aspects, transistor Q29, transistor Q30, transistor Q31, transistor Q32, transistor Q37, and transistor Q38 are p-type transistors. In some aspects, transistor Q33, transistor Q34, transistor Q35, transistor Q36, transistor Q40, and transistor Q39 are n-type transistors.

Transistor Q33 and transistor Q40 are gated by the clock signal. Transistor Q31 and transistor Q38 are gated by the inverse clock signal. Transistor Q29 and transistor Q36 are gated by the set signal. Transistor Q32 and transistor Q34 are gated by the reset signal. The drain of transistor Q29 is coupled to the source of transistor Q30. Transistor Q32 is coupled between the source of transistor Q29 and the drain of transistor Q30.

The source of transistor Q31 is coupled to the drain of transistor Q30. The drain of transistor Q33 is coupled to the drain of transistor Q31. The drain of transistor Q34 is coupled to the source of transistor Q33. The drain of transistor Q35 and the drain of transistor Q36 are coupled to the source of transistor Q34.

The gate of transistor Q37 and the gate of transistor Q39 are coupled to the drain of transistor Q31. The source of transistor Q38 is coupled to the drain of transistor Q37. The drain of transistor Q40 is coupled to the drain of transistor Q38. The drain of transistor Q39 is coupled to the source of transistor Q40. The drain of transistor Q40 is coupled to the gate of Q35 and to the gate of transistor Q30.

Inverse data master block 412 includes a transistor Q41, a transistor Q42, a transistor Q43, a transistor Q44, a transistor Q45, a transistor Q46, a transistor Q47, a transistor Q48, a transistor Q49, and a transistor Q50. In some aspects, transistor Q41, transistor Q42, transistor Q45, transistor Q46, transistor Q47 are p-type transistors. In some aspects, transistor Q44, transistor Q43, transistor Q48, transistor Q49, and transistor Q50 are n-type transistors.

Transistor Q41 and transistor Q43 are coupled to the inverse data signal at their respective gate. Transistor Q42 is gated by the inverse clock signal and transistor Q44 is gated by the clock signal. Transistor Q45 and transistor Q50 are gated by the set signal. Transistor Q47 and transistor Q48 are gated by the reset signal.

The drain of transistor Q41 is coupled to the source of transistor Q42. The drain of transistor Q42 is coupled to the drain of transistor Q44. The source of transistor Q44 is coupled to the transistor Q43.

The drain of transistor Q45 is coupled to the source of transistor Q46. The gate of transistor Q46 is coupled to the drain of transistor Q42. Transistor Q47 is coupled between the source of transistor Q45 and the drain of transistor Q46. The drain of transistor Q48 is coupled to the drain of transistor Q46. The drain of transistor Q49 and the drain of transistor Q50 are coupled to the source of transistor Q48.

Inverse master slave switch 414 includes transistor Q51 and a transistor Q52. In some aspects, transistor Q51 may be a p-type transistor. Transistor Q52 may be a n-type transistor. The source of transistor Q51 is coupled to the source of transistor Q52 and to the drain of transistor Q46.

Inverse slave block 416 includes a transistor Q53, a transistor Q54, a transistor Q55, and a transistor Q56. In some aspects, transistor Q53 and transistor Q55 may be n-type transistors. Transistor Q54 and transistor Q56 may be n-type transistor. The drain of transistor Q53 and the drain of transistor Q54 are coupled to the gate of transistor Q55 and the gate of transistor Q56. The gate of transistor Q53 and the gate of transistor Q54 are coupled to the drain of transistor Q53. The output signal may be taken from the drain of transistor Q55.

A truth table for the proposed differential flip-flop design, as shown in FIG. 4, is shown below.

TABLE 1

Truth table

| Input | | | | | Output | | Note |
|---|---|---|---|---|---|---|---|
| D | DB | RD | SD | clk | Q | Qn | |
| 1 | 0 | 0 | 0 | Rise edge | 1 | 0 | |
| 0 | 1 | 0 | 0 | Rise edge | 0 | 1 | |
| 1 | 1 | — | — | — | | | Illegal |
| 0 | 0 | — | — | — | | | Illegal |
| — | — | 1 | — | — | 0 | 1 | |
| — | — | 0 | 1 | — | 1 | 0 | |

Figure 5:
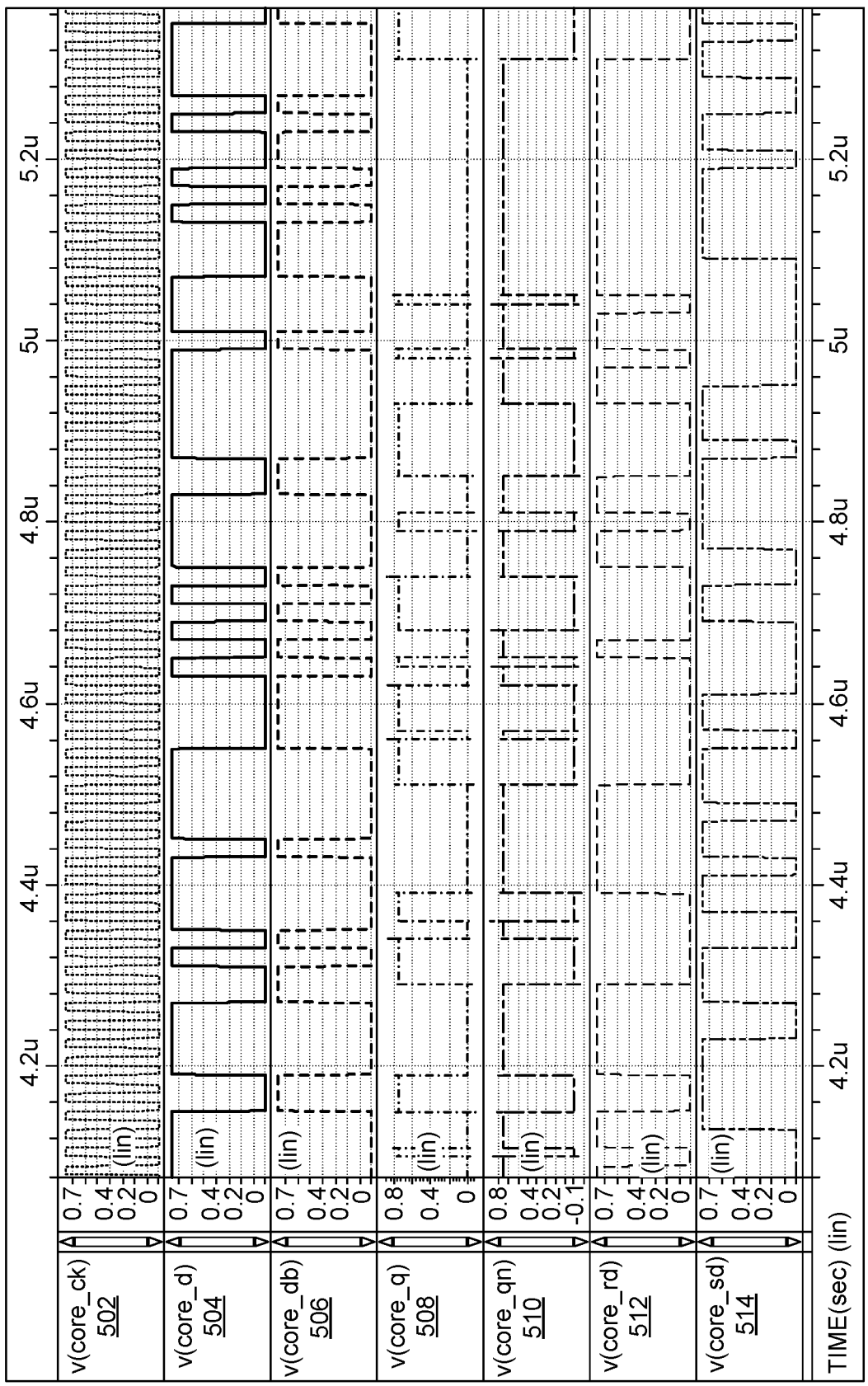
FIG. 5 is a schematic that shows a timing diagram for a differential flip-flop with a set and reset functionality, in accordance with an embodiment of the present disclosure.

A timing diagram for the differential flip-flop design shown in FIG. 4 is shown in FIG. 5. As shown by trace 504 and trace 506 in FIG. 5, input signals (D and DB (an inverted input signal) are complementary input signals. The inverted output signal Qn and the non-inverted output signal Q shown by trace 510 and trace 508 respectively, are generated according to the truth table shown in table 1. Trace 502 shows a clock signal. Trace 512 shows a reset signal. Trace 514 shows a set signal. An example active high reset/set is shown about t=5.18u.

Table 2 illustrates exemplary performance comparison data for a reference cell using an additional inverter in the data input to the inverted output signal path and a cell with the differential flip-flop design as shown in FIG. 4.

TABLE 2

Exemplary results

| | Path | Average clock to output (ps) | Setup and hold (ps) |
|---|---|---|---|
| Reference cell Design | Q | 55.18 52.15 | 2.47 1.64 |
| Reference cell Design Loading | QN | 46.18 51.62 | 2.48 0.74 |
| | Input D | 33 fF | |
| | Input DB | 32 fF | |

Accordingly, the differential flip-flops with set and reset as shown in FIG. 4 may reduce the phase difference between the generated inverted and non-inverted output signals. Further, faster clocks may be used, and both set and reset inputs may be available for consumption.

Figure 6:
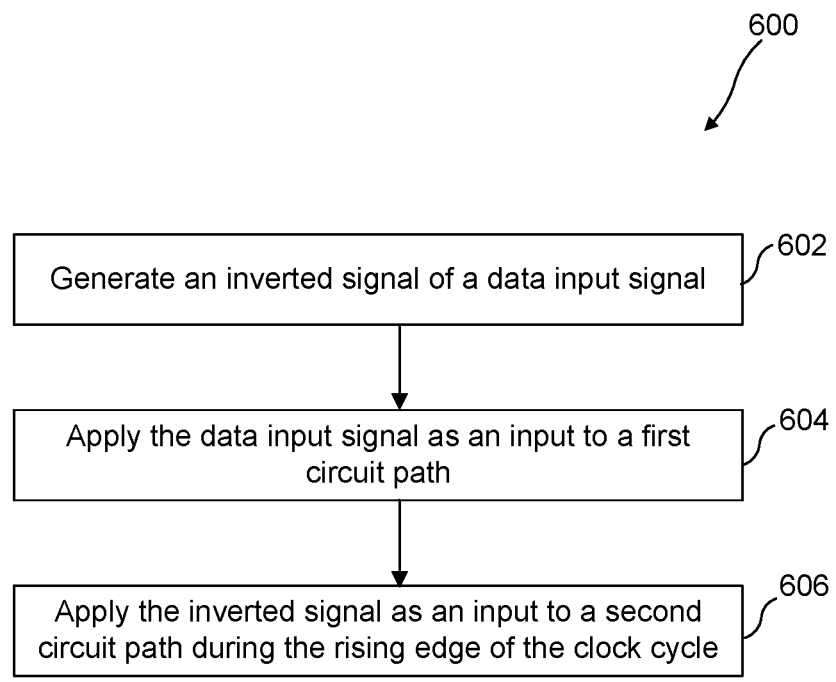
FIG. 6 is a flowchart of a method for generating a signal and an inverted signal, in accordance with an embodiment of the present disclosure.

FIG. 6 is a flowchart of a method 600 for generating a signal and an inverted signal, in accordance with an embodiment of the present disclosure.

In 602, an inverted signal of a data input signal is generated. In some aspects, the inverted signal of the data input signal and the data input signal are available for input during a rising edge of a clock cycle. In some aspects, the inverted signal may be generated using an inverter.

In 604, the data input signal may be applied as an input to a first circuit path during the rising edge of the clock cycle to generate an output signal.

In 606, the inverted signal is applied as an input to a second circuit path during the rising edge of the clock cycle. In some aspects, the second circuit path may be identical to the first circuit path. The second circuit path may have an identical number of elements (e.g., transistors) as the first circuit path. In some aspects, the second circuit path may be substantially similar to the first circuit path. For example, the first circuit path and the second circuit path may have an identical number of latches. In some aspects, the first circuit path may comprise a first master latch and a first slave latch. The second circuit path may also comprise a second master latch and a second slave latch.

In some aspects, the first circuit path may receive a set signal or a reset signal at the first circuit path. The set signal or reset signal may be passed to the second circuit path through a feedback circuit.

Figure 7:
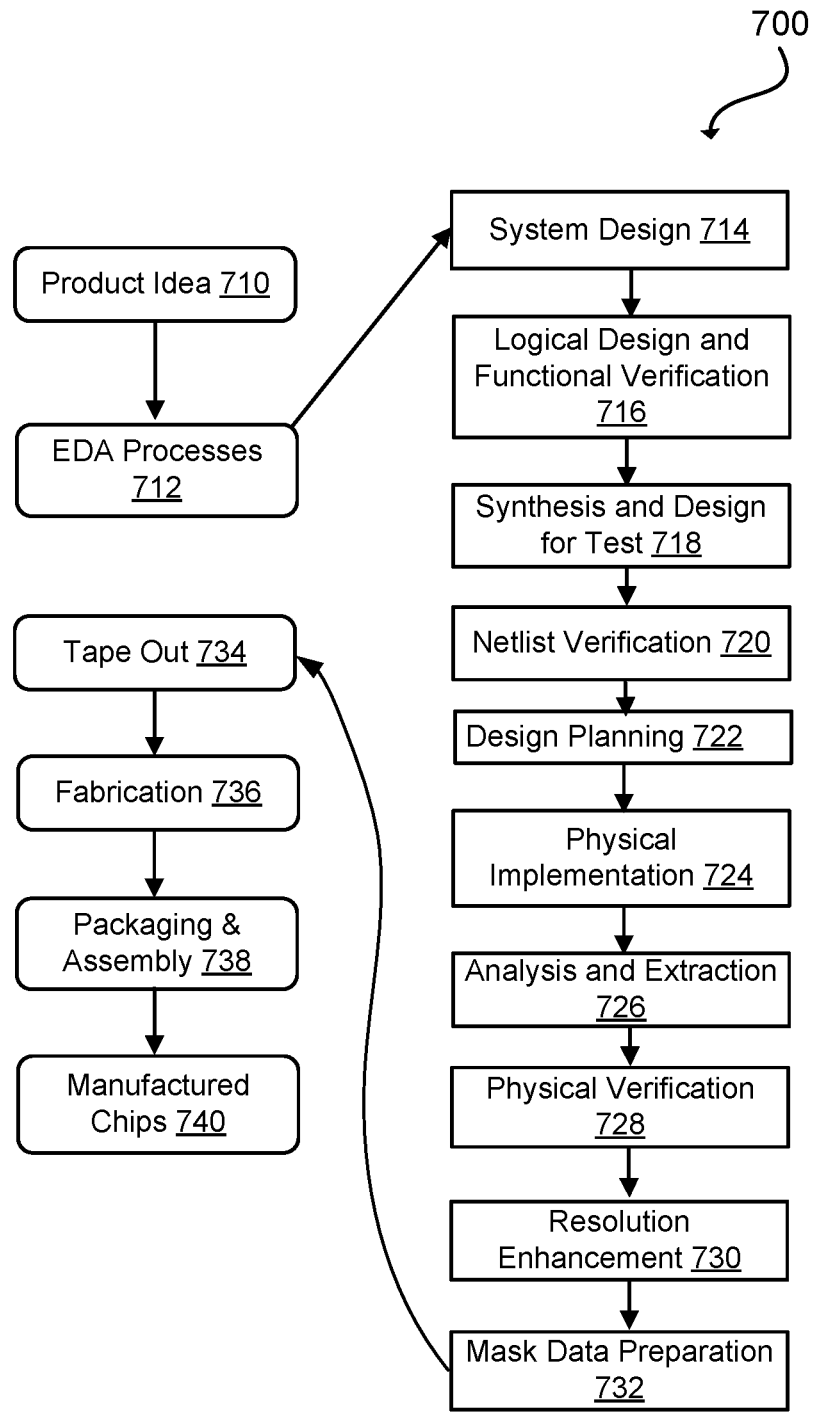
FIG. 7 depicts a flowchart of various processes used during the design and manufacture of an integrated circuit in accordance with some embodiments of the present disclosure.

FIG. 7 illustrates an example set of processes 700 used during the design, verification, and fabrication of an article of manufacture such as an integrated circuit to transform and verify design data and instructions that represent the integrated circuit. Each of these processes can be structured and enabled as multiple modules or operations. The term 'EDA' signifies the term 'Electronic Design Automation.' These processes start with the creation of a product idea 710 with information supplied by a designer, information which is transformed to create an article of manufacture that uses a set of EDA processes 712. When the design is finalized, the design is taped-out 734, which is when artwork (e.g., geometric patterns) for the integrated circuit is sent to a fabrication facility to manufacture the mask set, which is then used to manufacture the integrated circuit. After tape-out, a semiconductor die is fabricated 736 and packaging and assembly processes 738 are performed to produce the finished integrated circuit 740.

Specifications for a circuit or electronic structure may range from low-level transistor material layouts to high-level description languages. A high-level of representation may be used to design circuits and systems, using a hardware description language ('HDL') such as VHDL, Verilog, SystemVerilog, SystemC, MyHDL or OpenVera. The HDL description can be transformed to a logic-level register transfer level ('RTL') description, a gate-level description, a layout-level description, or a mask-level description. Each lower representation level that is a more detailed description adds more useful detail into the design description, for example, more details for the modules that include the description. The lower levels of representation that are more detailed descriptions can be generated by a computer, derived from a design library, or created by another design automation process. An example of a specification language at a lower level of representation language for specifying more detailed descriptions is SPICE, which is used for detailed descriptions of circuits with many analog components. Descriptions at each level of representation are enabled for use by the corresponding systems of that layer (e.g., a formal verification system). A design process may use a sequence depicted in FIG. 7. The processes described by be enabled by EDA products (or EDA systems).

During system design 714, functionality of an integrated circuit to be manufactured is specified. The design may be optimized for desired characteristics such as power consumption, performance, area (physical and/or lines of code), and reduction of costs, etc. Partitioning of the design into different types of modules or components can occur at this stage.

During logic design and functional verification 716, modules or components in the circuit are specified in one or more description languages and the specification is checked for functional accuracy. For example, the components of the circuit may be verified to generate outputs that match the requirements of the specification of the circuit or system being designed. Functional verification may use simulators and other programs such as testbench generators, static HDL checkers, and formal verifiers. In some embodiments, special systems of components referred to as 'emulators' or 'prototyping systems' are used to speed up the functional verification.

During synthesis and design for test 718, HDL code is transformed to a netlist. In some embodiments, a netlist may be a graph structure where edges of the graph structure represent components of a circuit and where the nodes of the graph structure represent how the components are interconnected. Both the HDL code and the netlist are hierarchical articles of manufacture that can be used by an EDA product to verify that the integrated circuit, when manufactured, performs according to the specified design. The netlist can be optimized for a target semiconductor manufacturing technology. Additionally, the finished integrated circuit may be tested to verify that the integrated circuit satisfies the requirements of the specification.

During netlist verification 720, the netlist is checked for compliance with timing constraints and for correspondence with the HDL code. During design planning 722, an overall floor plan for the integrated circuit is constructed and analyzed for timing and top-level routing.

During layout or physical implementation 724, physical placement (positioning of circuit components such as transistors or capacitors) and routing (connection of the circuit components by multiple conductors) occurs, and the selection of cells from a library to enable specific logic functions can be performed. As used herein, the term 'cell' may specify a set of transistors, other components, and interconnections that provides a Boolean logic function (e.g., AND, OR, NOT, XOR) or a storage function (such as a flip-flop or latch). As used herein, a circuit 'block' may refer to two or more cells. Both a cell and a circuit block can be referred to as a module or component and are enabled as both physical structures and in simulations. Parameters are specified for selected cells (based on 'standard cells') such as size and made accessible in a database for use by EDA products.

During analysis and extraction 726, the circuit function is verified at the layout level, which permits refinement of the layout design. During physical verification 728, the layout design is checked to ensure that manufacturing constraints are correct, such as DRC constraints, electrical constraints, lithographic constraints, and that circuitry function matches the HDL design specification. During resolution enhancement 730, the geometry of the layout is transformed to improve how the circuit design is manufactured.

During tape-out, data is created to be used (after lithographic enhancements are applied if appropriate) for production of lithography masks. During mask data preparation 732, the 'tape-out' data is used to produce lithography masks that are used to produce finished integrated circuits.

A storage subsystem of a computer system (such as computer system 800 of FIG. 8) may be used to store the programs and data structures that are used by some or all of the EDA products described herein, and products used for development of cells for the library and for physical and logical design that use the library.

Figure 8:
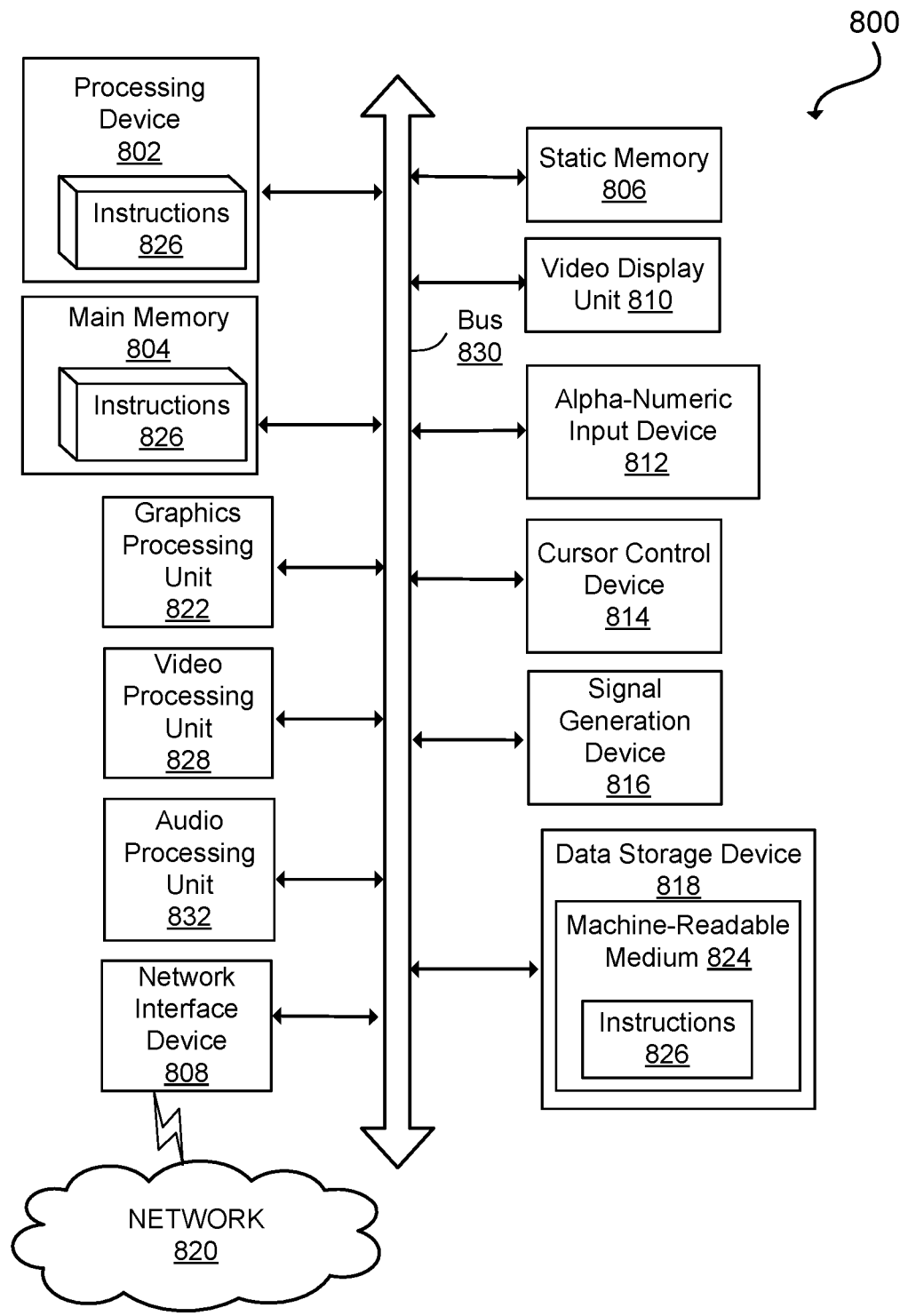
FIG. 8 depicts a diagram of an example computer system in which embodiments of the present disclosure may operate.

FIG. 8 illustrates an example machine of a computer system 800 within which a set of instructions, for causing the machine to perform any one or more of the methodologies discussed herein, may be executed. In alternative implementations, the machine may be connected (e.g., networked) to other machines in a LAN, an intranet, an extranet, and/or the Internet. The machine may operate in the capacity of a server or a client machine in client-server network environment, as a peer machine in a peer-to-peer (or distributed) network environment, or as a server or a client machine in a cloud computing infrastructure or environment.

The machine may be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 800 includes a processing device 802, a main memory 804 (e.g., read-only memory (ROM), flash memory, dynamic random access memory (DRAM) such as synchronous DRAM (SDRAM), a static memory 806 (e.g., flash memory, static random access memory (SRAM), etc.), and a data storage device 818, which communicate with each other via a bus 830.

Processing device 802 represents one or more processors such as a microprocessor, a central processing unit, or the like. More particularly, the processing device may be complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 802 may also be one or more special-purpose processing devices such as an application specific integrated circuit (ASIC), a field programmable gate array (FPGA), a digital signal processor (DSP), network processor, or the like. The processing device 802 may be configured to execute instructions 826 for performing the operations and steps described herein.

The computer system 800 may further include a network interface device 808 to communicate over the network 820. The computer system 800 also may include a video display unit 810 (e.g., a liquid crystal display (LCD) or a cathode ray tube (CRT)), an alphanumeric input device 812 (e.g., a keyboard), a cursor control device 814 (e.g., a mouse), a graphics processing unit 822, a signal generation device 816 (e.g., a speaker), graphics processing unit 822, video processing unit 828, and audio processing unit 832.

The data storage device 818 may include a machine-readable storage medium 824 (also known as a non-transitory computer-readable medium) on which is stored one or more sets of instructions 826 or software embodying any one or more of the methodologies or functions described herein. The instructions 826 may also reside, completely or at least partially, within the main memory 804 and/or within the processing device 802 during execution thereof by the computer system 800, the main memory 804 and the processing device 802 also constituting machine-readable storage media.

In some implementations, the instructions 826 include instructions to implement functionality corresponding to the present disclosure. While the machine-readable storage medium 824 is shown in an example implementation to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine and the processing device 802 to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm may be a sequence of operations leading to a desired result. The operations are those requiring physical manipulations of physical quantities. Such quantities may take the form of electrical or magnetic signals capable of being stored, combined, compared, and otherwise manipulated. Such signals may be referred to as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the present disclosure, it is appreciated that throughout the description, certain terms refer to the action and processes of a computer system, or similar electronic computing device, that manipulates and transforms data represented as physical (electronic) quantities within the computer system's registers and memories into other data similarly represented as physical quantities within the computer system memories or registers or other such information storage devices.

The present disclosure also relates to an apparatus for performing the operations herein. This apparatus may be specially constructed for the intended purposes, or it may include a computer selectively activated or reconfigured by a computer program stored in the computer. Such a computer program may be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various other systems may be used with programs in accordance with the teachings herein, or it may prove convenient to construct a more specialized apparatus to perform the method. In addition, the present disclosure is not described with reference to any particular programming language. It will be appreciated that a variety of programming languages may be used to implement the teachings of the disclosure as described herein.

The present disclosure may be provided as a computer program product, or software, that may include a machine-readable medium having stored thereon instructions, which may be used to program a computer system (or other electronic devices) to perform a process according to the present disclosure. A machine-readable medium includes any mechanism for storing information in a form readable by a machine (e.g., a computer). For example, a machine-readable (e.g., computer-readable) medium includes a machine (e.g., a computer) readable storage medium such as a read only memory ("ROM"), random access memory ("RAM"), magnetic disk storage media, optical storage media, flash memory devices, etc.

In the foregoing disclosure, implementations of the disclosure have been described with reference to specific example implementations thereof. It will be evident that various modifications may be made thereto without departing from the broader spirit and scope of implementations of the disclosure as set forth in the following claims. Where the disclosure refers to some elements in the singular tense, more than one element can be depicted in the figures and like elements are labeled with like numerals. The disclosure and drawings are, accordingly, to be regarded in an illustrative sense rather than a restrictive sense.

What is claimed is:

1. A circuit, comprising:
   a first master stage comprising a data input line;
   a second master stage comprising an inverse data input line;
   a first slave stage coupled to an output of the first master stage; and
   a second slave stage coupled to an output of the second master stage, wherein the first slave stage is configured to generate an output signal during a rising edge of a clock cycle of a clock signal and the second slave stage is configured to generate an inverted output signal during the rising edge of the clock cycle and wherein the output signal and the inverted output signal are available concurrently; and
   a cross-coupled circuit, wherein the cross-coupled circuit is coupled between an output of the first master stage and the output of the second master stage, wherein the cross-coupled circuit comprises a transistor gated by the clock signal.

2. The circuit of claim 1, wherein the first master stage comprises a first inverter having an input end connected to the data input line and an output end connected to a second inverter and wherein the second master stage comprises a third inverter having an input end connected to the inverse data input line and an output end connected to a fourth inverter.

3. The circuit of claim 2, wherein the second inverter and the fourth inverter have a set/reset functionality.

4. The circuit of claim 2, wherein the second inverter comprises:
   a first transistor gated by a set signal and a second transistor gated by a reset signal.

5. The circuit of claim 1, further comprising:
   a first feedback circuit coupled between the first master stage and the second master stage; and
   a second feedback circuit coupled between the first slave stage and the second slave stage, wherein the second feedback circuit is comprised by the cross-coupled circuit.

6. The circuit of claim 5, wherein the first feedback circuit comprises a first inverter and a second inverter, wherein the first inverter has an input end connected to an output end of the second inverter and the second inverter has an input end connected to an output end of the first inverter.

7. The circuit of claim 1, wherein the first master stage comprises a first inverter and a second inverter and wherein the first inverter is a tri-state inverter.

8. The circuit of claim 7, wherein the tri-state inverter comprises a first n-type transistor, a second n-type transistor, a first p-type transistor, and a second p-type transistor; and wherein a gate of the first p-type transistor is coupled to the data input line, a gate of the second p-type transistor is coupled to an inverse of a clock signal, a gate of the first n-type transistor is coupled to the clock signal, and a gate of the second n-type transistor is coupled to the data input line.

9. The circuit of claim 1, further comprising:
a first switch; and
a second switch, wherein the first switch has an input end coupled to the first master stage and an output end connected to the first slave stage and wherein the second switch has an input end connected to the second master stage and an output end connected to the second slave stage.

10. The circuit of claim 9, wherein the first switch comprises a first transistor and a second transistor, wherein the first transistor is gated by the clock signal, the second transistor is gated by an inverse of the clock signal, respective sources of the first transistor and the second transistor are coupled to an output end of the first master stage, and respective drains of the first transistor and the second transistor are coupled to the input end of the first slave stage.

11. A method for generating an inverted signal and a non-inverted signal, the method comprising:
generating an inverted signal of a data input signal using an inverter, wherein the inverted signal of the data input signal and the data input signal are available for input during a rising edge of a clock cycle of a clock signal;
applying the data input signal as an input to a first circuit path during the rising edge of the clock cycle to generate an output signal; and
applying the inverted signal as an input to a second circuit path during the rising edge of the clock cycle to generate an inverted output signal during the rising edge of the clock cycle, wherein the output signal and the inverted output signal are available concurrently, wherein the output signal and the inverted output signal are coupled by a cross-coupled circuit comprising a transistor gated by the clock signal.

12. The method of claim 11, wherein the second circuit path is identical to the first circuit path.

13. The method of claim 11, wherein the first circuit path comprises a master latch and a slave latch.

14. The method of claim 11, further comprising:
receiving a set or reset signal at the first circuit path; and
passing the set or reset signal to the second circuit path through a feedback circuit.

15. A non-transitory computer readable medium comprising stored instructions, which when executed by a processor, cause the processor to:
generate an inverted signal of a data input signal using the inverter, wherein the inverted signal of the data input signal and the data input signal are available for input during a rising edge of a clock cycle of a clock signal;
apply the data input signal as an input to a first circuit path during the rising edge of the clock cycle to generate an output signal; and
apply the inverted signal to a second circuit path identical to the first circuit path during the rising edge of the clock cycle to generate an inverted output signal,
wherein the output signal and the inverted output signal are available concurrently, wherein the output signal and the inverted output signal are coupled by a cross-coupled circuit comprising a transistor gated by the clock signal.

16. The non-transitory computer readable medium of claim 15, wherein the first circuit path is identical to the second circuit path.

17. The non-transitory computer readable medium of claim 15, wherein the first circuit path comprises a master latch and a slave latch and the second circuit path comprises an additional master latch and an additional slave latch.

18. The non-transitory computer readable medium of claim 17, wherein the master latch comprises a data input line configured to receive the data input signal and the additional master latch comprises an inverse data input line configured to receive the inverted signal.

19. The non-transitory computer readable medium of claim 15, wherein the processor is further configured to:
receive a set or reset signal at the first circuit path; and
pass the set or reset signal to the second circuit path through a feedback circuit, wherein the feedback circuit comprises the cross-coupled circuit.

20. The non-transitory computer readable medium of claim 19, wherein the feedback circuit is coupled between a master latch of the first circuit path and another master latch of the second circuit path.

* * * * *